(12) United States Patent
Schenk

(10) Patent No.: US 11,824,668 B2
(45) Date of Patent: Nov. 21, 2023

(54) REDUNDANT SYSTEM AND METHOD OF OPERATING A REDUNDANT SYSTEM

(71) Applicant: Rohde & Schwarz GmbH & Co. KG, Munich (DE)

(72) Inventor: Lothar Schenk, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 136 days.

(21) Appl. No.: 16/984,932

(22) Filed: Aug. 4, 2020

(65) Prior Publication Data

US 2022/0045809 A1 Feb. 10, 2022

(51) Int. Cl.
*H04L 1/22* (2006.01)
*H04L 12/40* (2006.01)
*G06F 11/20* (2006.01)
*G06F 11/08* (2006.01)
*G06F 11/18* (2006.01)
*G06F 8/41* (2018.01)

(52) U.S. Cl.
CPC ................ *H04L 1/22* (2013.01); *G06F 11/08* (2013.01); *G06F 11/181* (2013.01); *G06F 11/2005* (2013.01); *H04L 12/40* (2013.01); *G02F 2201/506* (2013.01); *G06F 8/4435* (2013.01); *H04L 2012/40215* (2013.01)

(58) Field of Classification Search
None
See application file for complete search history.

(56) References Cited

U.S. PATENT DOCUMENTS

| | | | | |
|---|---|---|---|---|
| 4,644,301 A * | 2/1987 | Hecht | ........................ | H01P 1/10 333/262 |
| 6,308,286 B1 * | 10/2001 | Richmond | .............. | H04L 12/56 714/13 |
| 6,639,893 B1 * | 10/2003 | Chikenji | .................... | H04L 1/22 370/223 |
| 6,911,938 B1 * | 6/2005 | Das | ....................... | H04B 7/2041 455/13.3 |
| 2002/0059540 A1 * | 5/2002 | Mann | ................... | G06F 11/1076 370/244 |
| 2003/0177425 A1 * | 9/2003 | Okin | .................... | G06F 11/2005 714/724 |
| 2006/0153068 A1 * | 7/2006 | Dally | ......................... | H04L 1/22 370/219 |

(Continued)

FOREIGN PATENT DOCUMENTS

WO   WO1999014886 A1 * 3/1999

*Primary Examiner* — The Hy Nguyen
(74) *Attorney, Agent, or Firm* — CHRISTENSEN O'CONNOR JOHNSON KINDNESS PLLC

(57) ABSTRACT

A redundant system for processing at least one signal is described wherein the redundant system has N+1 devices include N operational devices and one reserve device. The N operational devices and the reserve device are interconnected with each other. The redundant system includes a system control integrated within one of the devices of the redundant system. The redundant system further includes switches that are associated with the operational devices. In case of a failure of a respective operational device, the system control is configured to cause at least one of the devices to operate the switch associated with the respective operational device having the failure. Further, a method of operating a redundant system for processing at least one signal is described.

16 Claims, 2 Drawing Sheets

(56) References Cited

U.S. PATENT DOCUMENTS

| | | | |
|---|---|---|---|
| 2008/0075082 A1* | 3/2008 | Ilan | H04L 29/12839 370/392 |
| 2010/0165892 A1* | 7/2010 | Cha | H04W 24/00 370/280 |
| 2011/0012675 A1* | 1/2011 | Machino | H03F 3/24 330/124 R |
| 2014/0225666 A1* | 8/2014 | Kusu | H03F 3/602 330/124 D |
| 2020/0073843 A1* | 3/2020 | Patel | H04L 12/40182 |

* cited by examiner

REDUNDANT SYSTEM AND METHOD OF OPERATING A REDUNDANT SYSTEM

FIELD OF THE DISCLOSURE

The present disclosure relates generally to a redundant system for processing at least one signal. Further, the present disclosure relates to a method of operating a redundant system for processing at least one signal.

BACKGROUND

Redundant systems, also called N+1-systems, are known in the state of the art in different technical fields. For instance, they are used in broadcast transmitter systems, air traffic control systems as well as satellite communication amplifier systems.

The redundant system typically includes N operational devices as well as one reserve device that is made operational in case of failure of one of the respective operational devices such that the entire system is still operable. The N+1 systems are advantageous redundant system as they require only one single reserve device for the N operational devices. In former times, each operational device has its own reserve device, resulting in high costs due to the high number of devices.

The redundant systems known in the state of the art have a centralized control module that is formed separately with respect to the devices of the redundant system, namely the operational devices as well as the reserve device(s). The centralized control module is used to monitor and to control the devices of the redundant system appropriately, particularly in case of an occurring failure.

However, the centralized control module is to a single point of failure which may result in a total failure of the redundant system in case of an error associated with the centralized control module.

Accordingly, there is a need for a redundant system having a lower risk with regard to a total failure of the redundant system.

SUMMARY

The present disclosure provides examples of a redundant system for processing at least one signal. In an embodiment, the redundant system has N+1 devices that include N operational devices and one reserve device. The N operational devices and the reserve device are interconnected with each other. The redundant system also includes a system control integrated within one of the devices of the redundant system. Further, the redundant system includes switches that are associated with the operational devices. In case of a failure of a respective operational device, the system control is configured to cause at least one of the devices to operate the switch associated with the respective operational device having the failure.

Moreover, the present disclosure provides examples of a method of operating a redundant system for processing at least one signal. The redundant system has N+1 devices that include N operational devices and one reserve device that are interconnected with each other. In an embodiment, the method includes the steps of:

detecting an occurring failure in one of the operational devices by a system control integrated within one of the devices of the redundant system, and causing at least one of the devices to operate a switch associated with the respective operational device having the failure.

A redundant system is provided that does not have a centralized control module which is a single point of failure of the entire redundant system as it may cause a total failure of the redundant system in case of an error associated with the centralized control module. This risk is avoided accordingly. The redundant system with the system control integrated within one of the several devices ensures that the single point of failure is avoided effectively since at least one of the devices of the redundant system includes the system control. Moreover, the devices are interconnected such that they can communicate with each other, thereby controlling the respective switches in order to remove the respective operational device with the failure from operation.

Generally, removing the respective operational device with the failure from operation means that the at least one switch associated with the respective operational device is operated such that the respective operational device is not connected with a dedicated input anymore, as signals received via the dedicated input are routed to the reserve device that replaces the respective operational device.

In some embodiments, the switches that are associated with the operational devices may be established as relays.

The redundant system may include at least two devices, namely one operational device and one reserve device, wherein the respective roles of the devices are specified previously. Typically, the redundant system may include more than two operational devices such that N is equal or greater than two.

In the initial state of the redundant system, the reserve device is not operable, but the reserve device is provided for replacing one of the operational devices in case of an occurring failure.

The at least one of the devices caused to operate the switch associated with the respective operational device having the failure may also be called operating device in order to indicate that this respective device, namely the operating device, is the one that operates/controls the respective switch. The at least one of the devices caused to operate the switch, namely the operating device, is different to the operational device having the failure. This ensures that the switch can be operated in an appropriate manner even if the associated operational device has a total failure, resulting in a state in which the operational device would not be able to operate the associated switch. In order to avoid this scenario, the operating device is different to the operational device having the failure.

An aspect provides that the reserve device is made operational by operating the switch associated with the respective operational device having the failure while removing the respective operational device having the failure from operation. Accordingly, the reserve device is also associated with the respective switches that are assigned to the operational devices, thereby ensuring that the reserve device can replace any of the operational devices. The switches, for example their different switching positions, ensure that the reserve device can replace each of the operational devices.

In case of failure of any of the operational devices, the switch associated with this specific operational is controlled by another operational device or rather the reserve device such that the operational device having the failure is removed from operation while simultaneously making the reserve device operational instead of the operational device having the failure that has been removed. Accordingly, the respective switches are associated with the corresponding operational device and the reserve device. Put differently, all switches are associated with the reserve device and the corresponding operational device.

According to another aspect, the at least one of the devices, which operates the switch associated with the respective operational device having the failure, is the adjacent device of the respective operational device having the failure. As already mentioned, the at least one of the devices, which operates the switch associated with the respective operational device having the failure, corresponds to the operating device. Accordingly, the devices control the respective switch of their respective adjacent device, thereby ensuring that the switch associated with a faulty operational device can be operated even if the operational device has a total failure, resulting in an inoperability of the respective operational device. In other words, a control chain is established between all of the devices since they control the respective switches of their respective adjacent device appropriately.

For instance, two switches are associated with each operational device, wherein one of the two switches is associated with an input side and the other one is associated with an output side of the respective operational device. Thus, the signal path through the respective operational device can be altered by controlling the respective switches associated with the input side and the output side of the respective operational device. In some embodiments, this ensures that an input signal forwarded to the input is routed through the reserve device for being processed by the reserve device. Then, the reserve device forwards the processed signal to an output via the switch associated with the output side of the respective operational device having the failure that was removed from operation. Therefore, it is ensured that an input signal is processed in a similar manner since the reserve device has been made operational while replacing the respective operational device having the failure that has been removed from operation previously by controlling the switches accordingly.

In some embodiments, both switches associated with the input side and the output side may be operated simultaneously. This ensures that a continuous signal path is ensured in which the reserve device is incorporated in case of failure of one of the operational devices.

According to another aspect, the system control is monitoring all devices. Hence, the system control also has a monitoring functionality. The system control integrated within one of the devices establishes a communication link with all of the operational devices in order to receive monitoring information from the respective devices, thereby evaluating whether a failure occurs or not.

The respective communication link may be established as a bidirectional communication link such that information can be forwarded from the system control to the devices, for instance control signals. Further, information can be forwarded from the respective devices to the system control integrated within one of the devices in order to forward (monitoring) information.

Another aspect provides that the system control automatically controls the at least one device, namely the operating device, such that the at least one device, namely the operating device, initiates the switching operation of the switch associated with the respective operational device having the failure. Since the system control receives information of all operational devices, it is enabled to automatically evaluate the monitoring information received in order to automatically control the at least one device, namely the operating device, to initiate the switching operation in case of an occurring failure of the respective operational device having the failure.

Generally, the operational device having the failure may still be operable, but the monitoring information already indicate that a failure is upcoming. Thus, the system control already removes the respective operational device from operation in order to avoid a more serious failure of the respective operational device.

Hence, the occurring failure includes failures that already cause losses, for instance performance losses, as well as failures that do not yet cause losses, for instance performance losses, but that will cause losses in the future, namely so-called upcoming failures.

In addition, another device may be enabled to provide the system control in case of failure of the device initially providing the system control. Therefore, a redundant system concerning the system control is provided such that a failure of the respective device having the system control initially is ensured. In some embodiments, at least two devices of the redundant system are enabled to provide the system control for the entire redundant system.

Moreover, all of the devices may have the system control functionality such that they can stand in when a failure of the device occurs that initially provides the system control.

However, it is typically sufficient that two devices of the redundant system provide the system control (functionality), for example the reserve device as well as one of the operational devices.

According to an embodiment, the system control is initially integrated within the reserve device. The reserve device is not operated at the beginning, namely in the initial state of the redundant system, such that it is most improbable that the reserve device will fail during the operation of the redundant system.

Nevertheless, at least one other operational device may have the system control (functionality) as a back-up for the reserve device.

In some embodiments, the interconnection between the devices of the redundant system may be established by a control bus. Therefore, the system control is enabled to control the respective devices individually by addressing control signals or rather messages appropriately.

For instance, the control bus is an Ethernet bus or a Controller Area Network (CAN) bus. Thus, the control bus may be a serial bus.

Moreover, each operational device of the redundant system may be connected with at least one dedicated input switch that is associated with an input side of the respective operational device. The input switch is used to direct input signals received via an input associated with the operational device to the respective operational device in its operational mode. In case of failure of the respective operational device, the input switch is operated, thereby setting the input switch into another switching position in which the input signal is routed towards the reserve device for being processed by the reserve device accordingly.

In addition, each operational device of the redundant system is connected with at least one dedicated output switch that is associated with an output side of the respective operational device. In the operational mode, the output switch is set in a switching position such that the signals processed by the respective operational device are forwarded to an output via the output switch. In case of failure of the respective operational device, the output switch has been set into another switching position in which the signals forwarded by the reserve device are routed via the respective output switch to an output of the redundant system.

Generally, the redundant system has several inputs and several outputs, for example wherein the number of inputs and the number of outputs are equal. In some embodiments, the number of inputs, the number of outputs and the number of operational devices are equal. Put differently, each operational device is associated with one input as well as one output, namely exactly one input and exactly one output.

Each switch may have four ports. The four ports may be associated with two different switching positions of the respective switch. This generally ensures that the reserve device can be integrated completely such that signals are routed via the reserve device when the reserve device replaces one of the operational devices which has the failure. Moreover, the switch ensures that the operational device having the failure can be removed from operation correctly, In some embodiments, the operational device with the failure is connected with a load, for instance a resistance.

In general, the redundant system may be a broadcasting system, an air traffic control system or a satellite communication amplifier system. The broadcasting system typically includes several broadcasting devices, wherein one of the several broadcasting devices is a reserve broadcasting device that will be activated in case of a failure of one of the operational broadcasting device. In a similar manner, the air traffic control system includes several radio devices that may also be interconnected with each other in a redundant manner while providing at least one reserve radio device. Moreover, the satellite communication amplifier system includes several power amplifier devices that are arranged in a redundant manner since one of the several power amplifier devices is established as a reserve power amplifier device that replaces one of the operational power amplifier device in case of an occurring failure.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
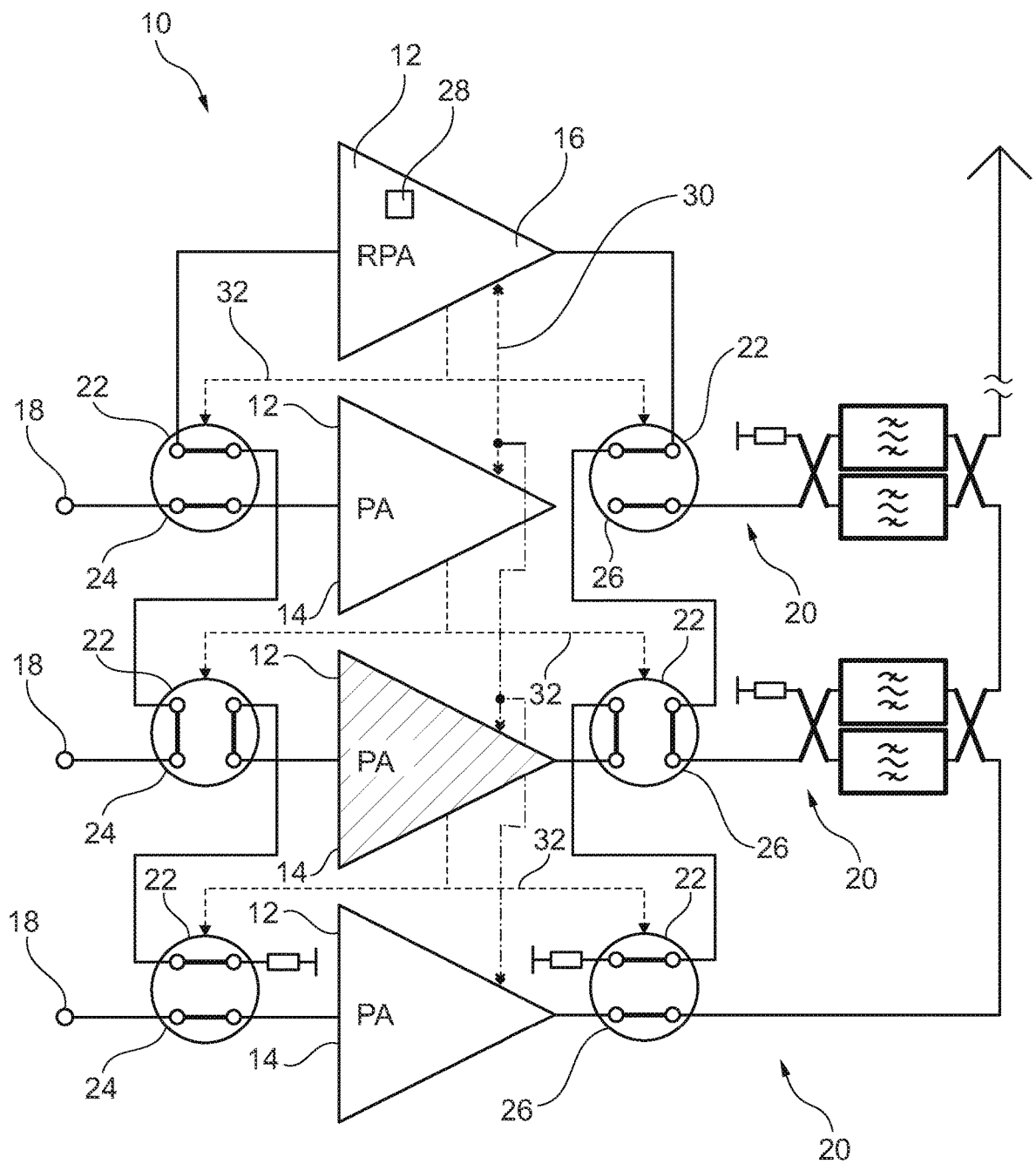
FIG. 1 schematically shows a redundant system according to a first embodiment of the present disclosure.

In FIG. 1, a redundant system 10 is shown that is established as a satellite communication amplifier system in the shown embodiment. The redundant system 10 includes N+1 devices 12 that are interconnected with each other as shown in FIG. 1. The N+1 devices 12 correspond to N operational devices 14 that are also labeled with "PA" (Power Amplifiers) as well as one reserve device 16 that is also labeled with "RPA" (Reserve Power Amplifier) in FIG. 1.

Accordingly, the redundant system 10 may also be called N+1-system in order to emphasize that N of the several devices 12 are operable in the initial/normal operation mode of the redundant system 10, which together share one common reserve device 16 that can replace any of the operational devices 14 in case of failure.

In the shown embodiment, the redundant system 10 includes four devices 12, namely three operational devices 14 as well as one reserve device 16.

The redundant system 10 has three inputs 18 that are associated with the three operational devices 14. In addition, the redundant system 10 has three outputs 20 that are also associated with the three operational devices 14. Accordingly, each operational device 14 is enabled to receive a corresponding signal via the dedicated input 18, to process the signal received, and to output the processed signal via the dedicated output 20.

In addition, the redundant system 10 includes switches 22 that are assigned to an input side of the respective operational devices 14 as well as an output side of the operational devices 14.

Accordingly, the several switches 22 can be distinguished into input switches 24 that are located between the respective inputs 18 and the respective operational device 14 as well as output switches 26 that are located between the respective operational device 14 and the respective outputs 20. In other words, the input switches 24 are associated with the input side of the respective operational device 14 since they are located between the respective input 18 and the corresponding operational device 14. The output switches 26 are associated with the output side of the respective operational device 14 since they are located between the respective output 20 and the corresponding operational device 14.

In addition, the redundant system has a system control 28 that is integrated within one of the several devices 12. In an embodiment, the system control can include one or more control circuits configured to carry out the functionality herein described. In the shown embodiment, the system control 28 is integrated within the reserve device 16 that is not operated in the initial state of the redundant system 10.

The system control 28, for example the reserve device 16, is interconnected with all operational devices 14 such that all devices 12 are interconnected with each other by a communication link. The communication link 30 may include or rather be established by a control bus such that the system control 28 is enabled to forward control signals to the respective devices 12. The respective control bus may be established as an Ethernet bus or a CAN bus.

The communication link 30 established between the devices 12 may be a bidirectional one such that the devices 12 are also enabled to forward monitoring information to the system control 28 such that the system control 28 is enabled to verify whether one of the respective devices 12, for example the operational devices 14, has a failure or not.

In FIG. 1, the communication link 30 is illustrated by two arrows at each end in order to emphasize its bidirectional character.

Accordingly, the system control 28 is monitoring all devices 12, for example during the operation of the redundant system 10.

Besides the communication link 30, for example the control bus, all but one of operational devices 14 as well as the reserve device 16 are connected with a control line 32 that ends at the switches 22 associated with the adjacent operational device 12.

In some embodiments, the reserve device 16 as well as the operational devices 14 are arranged in parallel, wherein the operational device 14 having only one adjacent device 12 is not connected with a respective control line 32. This specific operational device 14 is the lowest one in FIG. 1.

In general, the redundant system 10 is enabled to make the reserve device 16 operational in case of an occurring failure within one of the operational devices 14.

This is schematically shown in FIG. 1 since the second operational device 14, which is highlighted by the hatching, has a failure that was detected by the system control 28 integrated within the reserve device 16 due to the monitoring information received via the bidirectional communication link 30.

Accordingly, the system control 28 causes the first operational device 14 that is located adjacent to the operational device 14 having the failure to operate the switches 22 associated with the operational device 14 having the failure.

In other words, the operating device 14, namely the first operational device 14, causes the switches 22 associated with the second operational device 14 to switch or rather change their switching positions. This controlling is done via the communication link 30, namely the control bus.

This is also indicated by the dashed lines that are differently illustrated compared to the other dashed lines that illustrate the communication links among the other devices 12.

Hence, the system control 28 controls the operating device 14 to interact with the switches 22 of the adjacent operating device 14 having the failure, namely the dedicated input switch 24 as well as the dedicated output switch 26 that are associated with the input side and the output side of the adjacent operating device 14 having the failure.

The respective controlling of the switches 22 is done via the control lines 32 which are also illustrated differently in order to highlight that signals are exchanged via these control lines 32 in order to control the respective switches 22.

In some embodiments, the switches 22 associated with the operational device 14 having the failure are brought into a second switching position that differs from the first one which is the initial one as shown in FIG. 1 when comparing the switching positions of the switches 22.

In the second switching position, the respective operational device 14 having the failure is removed from operation while simultaneously making the reserve device 16 operational.

Both switches 22, namely the dedicated input switch 24 as well as the dedicated output switch 26, are operated simultaneously such that the signal received via the input 18 associated with the operational device 14 having the failure is routed through the reserve device 16 that forwards the signal to the respective output 20 that is associated with the operational device 14 having the failure.

As shown in FIG. 1, the respective switches 22 have four ports, wherein the switches 22 have two different switching positions. The first switching position is associated with the regular operation in which the respective operational device 14 is in operation, whereas the second switching position is associated with a reserve operation mode in which the reserve device 16 has been activated in order to replace the operational device 14 having the failure.

In general, the system control 28 is enabled to automatically gather all information from the devices 12 in order to identify an occurring failure.

Since the system control 28 is enabled to automatically gather and evaluate the respective information, the system control 28 is also enabled to automatically control the devices 12, thereby causing one of the devices 12 to operate the switches 22 that are associated with the operational device 14 having the failure. Hence, this respective operational device 14, namely the operational device 14 having the failure, is removed from operation.

Thus, the system control 28 automatically controls the at least one device 12, which initiates the switch operation, such that the at least one device 12 removes the operational device 14 having the failure from operation while simultaneously making the reserve device 16 operational, thereby ensuring the redundancy of the entire redundant system 10.

In general, the system control 28 may be integrated within one other device 12 additionally in order to establish a redundancy concerning the system control 28.

However, the reserve device 16 is not in operation usually such that the reserve device 16 is the best choice for integrating the system control 28 as the reserve device 16 is less prone to failure.

Generally, the system control 28 causes the at least one of the devices 12, namely the operating device 12, to operate the switch(es) 22 associated with the respective operational device 14 having the failure. The operating device 12 may turn the respective switch(es) 22 in order to set the switch (es) 22 into the second switching position, thereby activating the reserve device 16 that replaces the operational device 14 having the failure.

As mentioned above, the redundant system 10 shown in FIG. 1 corresponds to a satellite communication amplifier system, wherein the devices 12 relate to power amplifiers.

Figure 2:
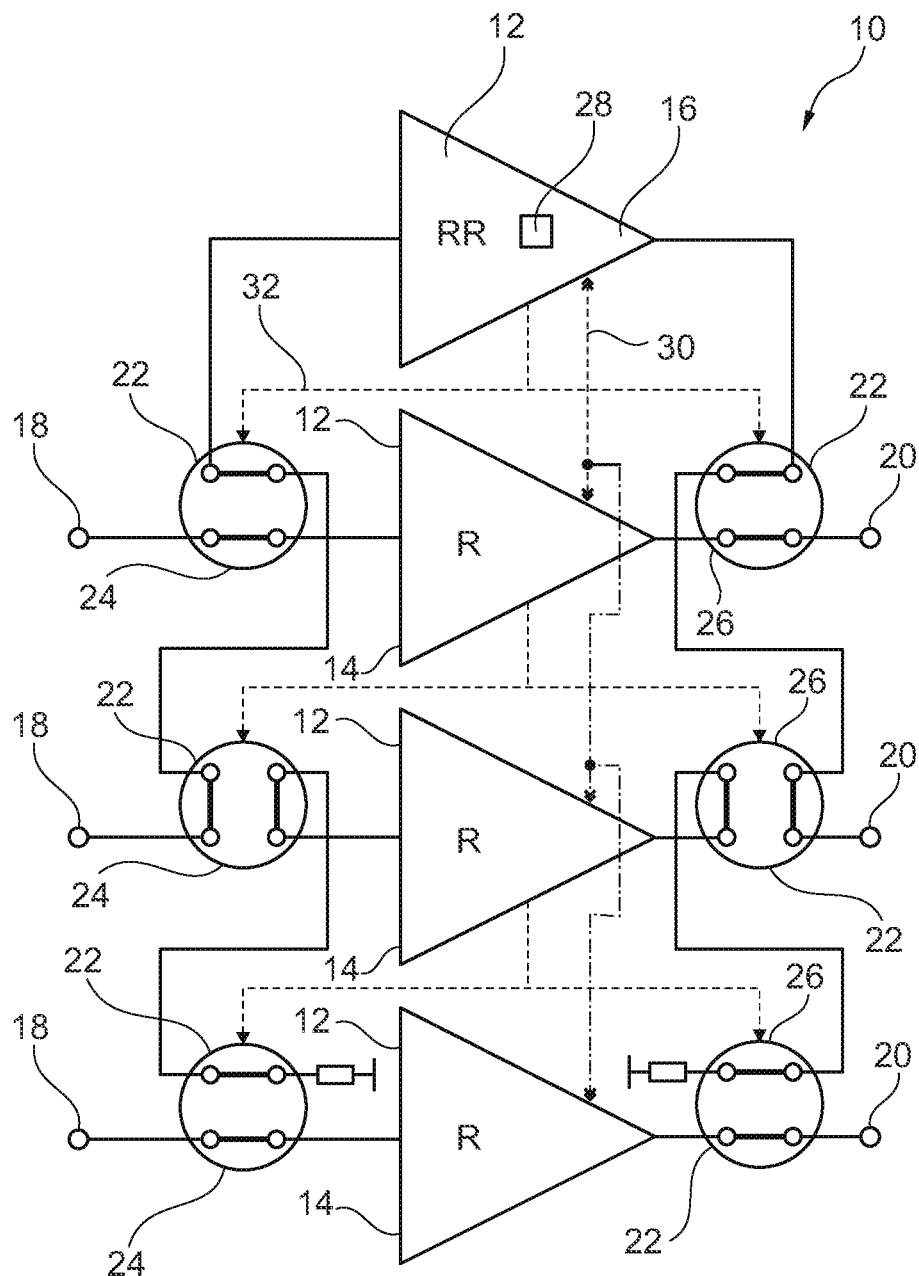
FIG. 2 schematically shows an overview of a redundant system according to a second embodiment of the present disclosure.

In FIG. 2, another redundant system 10 is shown that substantially corresponds to the one shown in FIG. 1.

However, the redundant system 10 shown in FIG. 2 corresponds to an air traffic control system since the respective devices 12 are established as radios.

This is indicated in FIG. 2 by the respective labels "R". The reserve device 16 is labeled with "RR" (Reserve Radio). However, the entire operation is similar to the one described before with respect to the redundant system 10 established as the satellite communication amplifier system.

Generally, the entire redundant system 10 may also be a broadcasting system that includes several broadcasting devices 12 that are interconnected with each other in a similar manner.

In general, the entire redundant system 10 is less prone to failure as a single point of failure is avoided.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some examples, the functionality described herein can be implemented by special purpose hardware-based computer systems or circuits, etc., or combinations of special purpose hardware and computer instructions.

Of course, in some embodiments, two or more of the aforementioned components, or parts thereof, can be integrated or share hardware and/or software, circuitry, etc. In some embodiments, these components, or parts thereof, may be grouped in a single location or distributed over a wide area. In circumstances were the components are distributed, the components are accessible to each other via communication links.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A redundant system having N+1 devices that comprise N operational devices and one reserve device, wherein the N operational devices and the reserve device are interconnected with each other, the redundant system comprising:
   a system control integrated within one of the devices of the redundant system; and
   input switches that are located between the operational devices and respective inputs as well as output switches that are located between the operational devices and respective outputs such that two switches are associated with each operational device, wherein the respective input switch is associated with an input side and the respective output switch is associated with an output side of the respective operational device,
   wherein each switch has four ports that are associated with two different switching positions of the respective switch,
   wherein, in case of a failure of a respective operational device, the system control is capable of controlling at least one of the devices to operate the input switch and the output switch which are associated with the respective operational device having the failure,
   wherein the at least one of the devices, which operates the input switch and the output switch which are associated with the respective operational device having the failure, is an adjacent device of the respective operational device having the failure,
   wherein a control chain is established between all of the devices such that the devices are only capable of controlling a switching operation at the input switch and the output switch associated with their respective adjacent device, and
   wherein the respective input switch associated with the input side and the respective output switch associated with the output side are operated simultaneously.

2. The redundant system according to claim 1, wherein the reserve device is made operational by operating the switch associated with the respective operational device having the failure while removing the respective operational device having the failure from operation.

3. The redundant system according to claim 1, wherein the system control is monitoring all devices.

4. The redundant system according to claim 1, wherein the system control automatically controls the at least one device such that the at least one device initiates the switching operation of the switch associated with the respective operational device having the failure.

5. The redundant system according to claim 1, wherein another device is enabled to provide the system control in case of failure of the device initially providing the system control.

6. The redundant system according to claim 1, wherein the system control is initially integrated within the reserve device.

7. The redundant system according to claim 1, wherein the interconnection between the devices of the redundant system is established by a control bus.

8. The redundant system according to claim 7, wherein the control bus is an Ethernet bus or a Controller Area Network bus (CAN bus).

9. The redundant system according to claim 1, wherein each operational device of the redundant system is connected with at least one dedicated input switch that is associated with an input side of the respective operational device.

10. The redundant system according to claim 1, wherein each operational device of the redundant system is connected with at least one dedicated output switch that is associated with an output side of the respective operational device.

11. The redundant system according to claim 1, wherein the redundant system is a broadcasting system, an air traffic control system or a satellite communication amplifier system.

12. The redundant system according to claim 1, wherein the N+1 devices are power amplifiers.

13. A method of operating a redundant system, the redundant system having N+1 devices that comprise N operational devices and one reserve device that are interconnected with each other, the method comprising:
    detecting an occurring failure in a respective operational device by a system control integrated within one of the devices of the redundant system, and
    causing at least one of the devices to operate an input switch associated with an input side of the respective operational device having the failure as well as to operate an output switch associated with an output side of the respective operational device having the failure,
    wherein the at least one of the devices, which operates the switches associated with the respective operational device having the failure, is an adjacent device of the respective operational device having the failure, and
    wherein a control chain is established between all of the devices such that the devices are only capable of controlling a switching operation at the input switch and the output switch associated with their respective adjacent device, and wherein the respective input switch associated with the input side and the respective output switch associated with the output side are operated simultaneously.

14. The method according to claim 13, wherein the reserve device is made operational by operating the switch associated with the respective operational device having the failure while removing the respective operational device having the failure from operation.

15. A redundant system for processing at least one signal, comprising:
    N+1 devices that comprise N operational devices and one reserve device, wherein the N operational devices and the one reserve device are interconnected with each other;
    a system control integrated within at least one of the devices of the redundant system;
    switches that are associated with the N operational devices, and
    wherein, in case of a failure of a respective operational device, the system control is capable to control at least one of the devices to operate the switch associated with the respective operational device having the failure, wherein at least two of the devices have a system control functionality such that one of the at least two devices having the system control functionality is capable of standing in when a failure of the other of the at least two devices occurs that initially provides the system control,
    wherein the N+1 devices are interconnected with each other by a communication link that comprises a control bus such that the system control is capable of forwarding control signals to the N+1 devices, and wherein the communication link between the N+1 devices is bidirectional such that the N+1 devices are also enabled to forward monitoring information to the system control, thereby enabling the system control to verify whether one of the operational devices has a failure or not, and
    wherein, besides the communication link, all but one of operational devices as well as the reserve device are connected with a control line that ends at the switches associated with an adjacent operational device.

16. The redundant system according to claim 15, wherein the N+1 devices are power amplifiers.

\* \* \* \* \*